(12) United States Patent
McNeil

(10) Patent No.: US 11,710,523 B2
(45) Date of Patent: *Jul. 25, 2023

(54) APPARATUS FOR DISCHARGING CONTROL GATES AFTER PERFORMING A SENSING OPERATION ON A MEMORY CELL

(71) Applicant: MICRON TECHNOLOGY, INC., Boise, ID (US)

(72) Inventor: Jeffrey S. McNeil, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

This patent is subject to a terminal disclaimer.

(21) Appl. No.: 17/371,482

(22) Filed: Jul. 9, 2021

(65) Prior Publication Data

US 2021/0335424 A1    Oct. 28, 2021

Related U.S. Application Data

(63) Continuation of application No. 16/861,435, filed on Apr. 29, 2020, now Pat. No. 11,069,408, which is a continuation of application No. 16/186,677, filed on Nov. 12, 2018, now Pat. No. 10,665,300.

(51) Int. Cl.
| | |
|---|---|
| *G11C 16/08* | (2006.01) |
| *G11C 16/04* | (2006.01) |
| *G11C 16/26* | (2006.01) |
| *G11C 16/14* | (2006.01) |
| *G11C 16/10* | (2006.01) |

(52) U.S. Cl.
CPC .......... *G11C 16/08* (2013.01); *G11C 16/0483* (2013.01); *G11C 16/10* (2013.01); *G11C 16/14* (2013.01); *G11C 16/26* (2013.01)

(58) Field of Classification Search
CPC ..... G11C 16/08; G11C 16/0483; G11C 16/10; G11C 16/14; G11C 16/26; G11C 16/32; G11C 5/147; G11C 16/30
See application file for complete search history.

(56) References Cited

U.S. PATENT DOCUMENTS

| | | |
|---|---|---|
| 7,206,235 B1 | 4/2007 | Lutze et al. |
| 9,412,463 B1 | 8/2016 | Chen et al. |
| 9,589,660 B1 | 3/2017 | Hashimoto et al. |
| 9,830,994 B1 | 11/2017 | Mitsuhira et al. |

(Continued)

*Primary Examiner* — J. H. Hur
(74) *Attorney, Agent, or Firm* — Dicke, Billig & Czaja, PLLC

(57) ABSTRACT

Apparatus having a controller configured to connect a string of series-connected memory cells (e.g., a NAND string) to a node, perform a sensing operation on a selected memory cell of the NAND string while the selected memory cell is connected to the node through a first field-effect transistor (FET) between the node and the NAND string and through a second FET between the first FET and the NAND string, connect a control gate of the first FET to receive a lower voltage level after performing the sensing operation, connect the control gate of the second FET to receive the lower voltage level after connecting the control gate of the first FET to receive the lower voltage level, and connect a control gate of the selected memory cell to receive the lower voltage level after connecting the control gate of the second FET to receive the lower voltage level.

25 Claims, 9 Drawing Sheets

(56) References Cited

U.S. PATENT DOCUMENTS

| | | | |
|---|---|---|---|
| 10,665,300 B1 | 5/2020 | McNeil | |
| 11,069,408 B2 * | 7/2021 | McNeil | G11C 16/08 |
| 2006/0245251 A1 | 11/2006 | Shirota et al. | |
| 2008/0186776 A1 | 8/2008 | Kim et al. | |
| 2011/0317489 A1 * | 12/2011 | Kim | H01L 27/11582 |
| | | | 365/185.18 |
| 2018/0211710 A1 | 7/2018 | Saito et al. | |

* cited by examiner

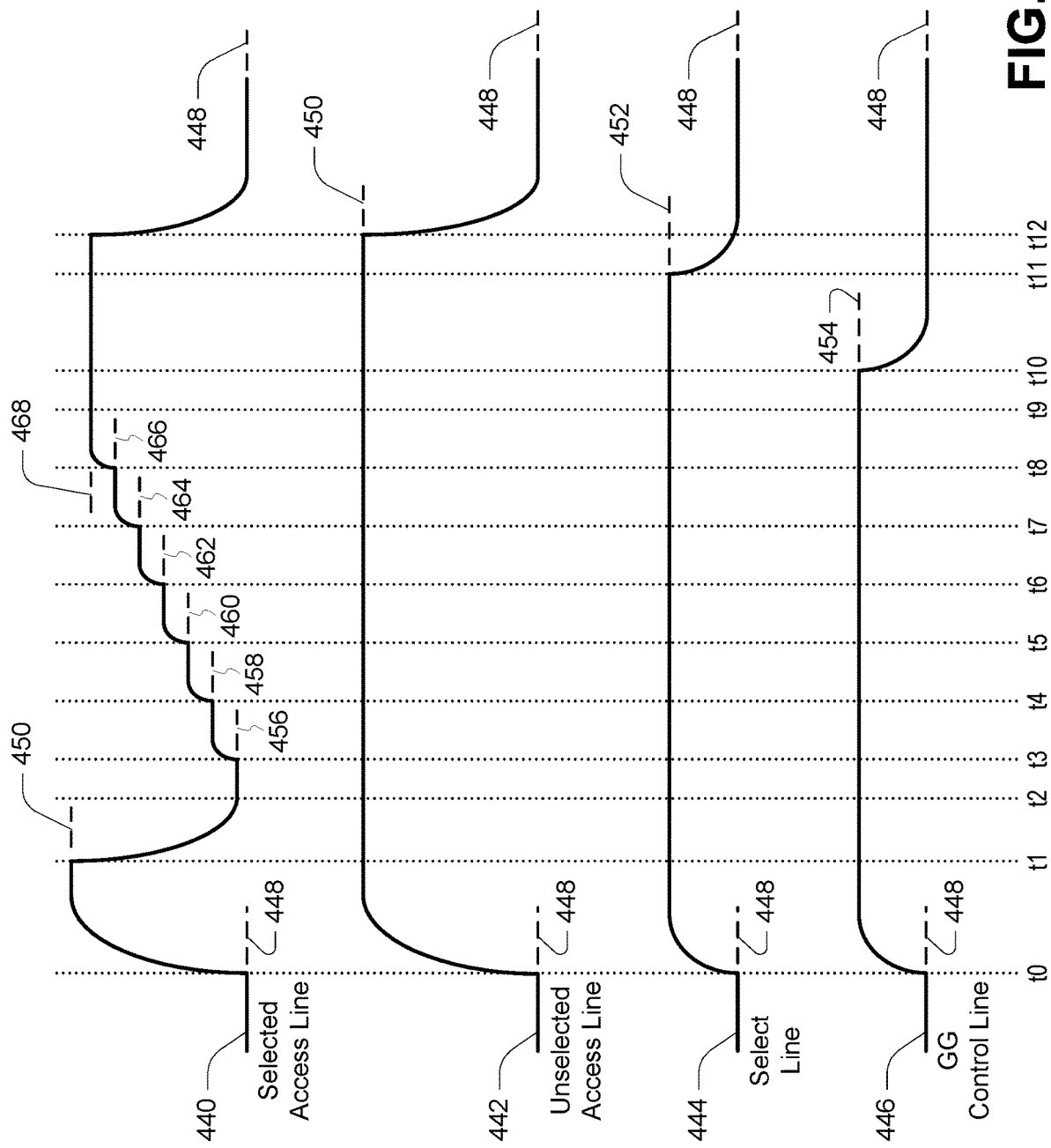

APPARATUS FOR DISCHARGING CONTROL GATES AFTER PERFORMING A SENSING OPERATION ON A MEMORY CELL

RELATED APPLICATIONS

This Application is a Continuation of U.S. application Ser. No. 16/861,435, titled "APPARATUS FOR DISCHARGING CONTROL GATES AFTER PERFORMING AN ACCESS OPERATION ON A MEMORY CELL," filed Apr. 29, 2020, issued as U.S. Pat. No. 11,069,408 on Jul. 20, 2021, which is a Continuation of U.S. application Ser. No. 16/186,677, titled "APPARATUS AND METHODS FOR DISCHARGING CONTROL GATES AFTER PERFORMING AN ACCESS OPERATION ON A MEMORY CELL," filed Nov. 12, 2018, issued as U.S. Pat. No. 10,665,300 on May 26, 2020, which are commonly assigned and incorporated herein by reference.

TECHNICAL FIELD

The present disclosure relates generally to memory and, in particular, in one or more embodiments, the present disclosure relates to apparatus and methods for discharging control gates after performing an access operation on a memory cell.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage ($V_t$) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Access operations, e.g., erase operations, programming operations and/or read operations, might be used to prepare a memory cell for programming, to program a memory cell to contain (e.g., represent) a particular data state representative of one or more digits (e.g., bits) of information, and/or to sense what data state a memory cell contains (e.g., represents). For example, a read operation might involve the application of particular voltage levels to a variety of conductive lines associated with an array of memory cells to connect a target memory cell to a data line and to a source to determine whether that target memory cell conducts in response to an applied voltage level (e.g., applied to its control gate). Following a sensing of whether the target memory cell was conductive, the various applied voltage levels might be discharged.

BRIEF DESCRIPTION OF THE DRAWINGS

FIGS. 4A-4B depict timing diagrams for methods of operating a memory in accordance with embodiments.

DETAILED DESCRIPTION

Figure 1:
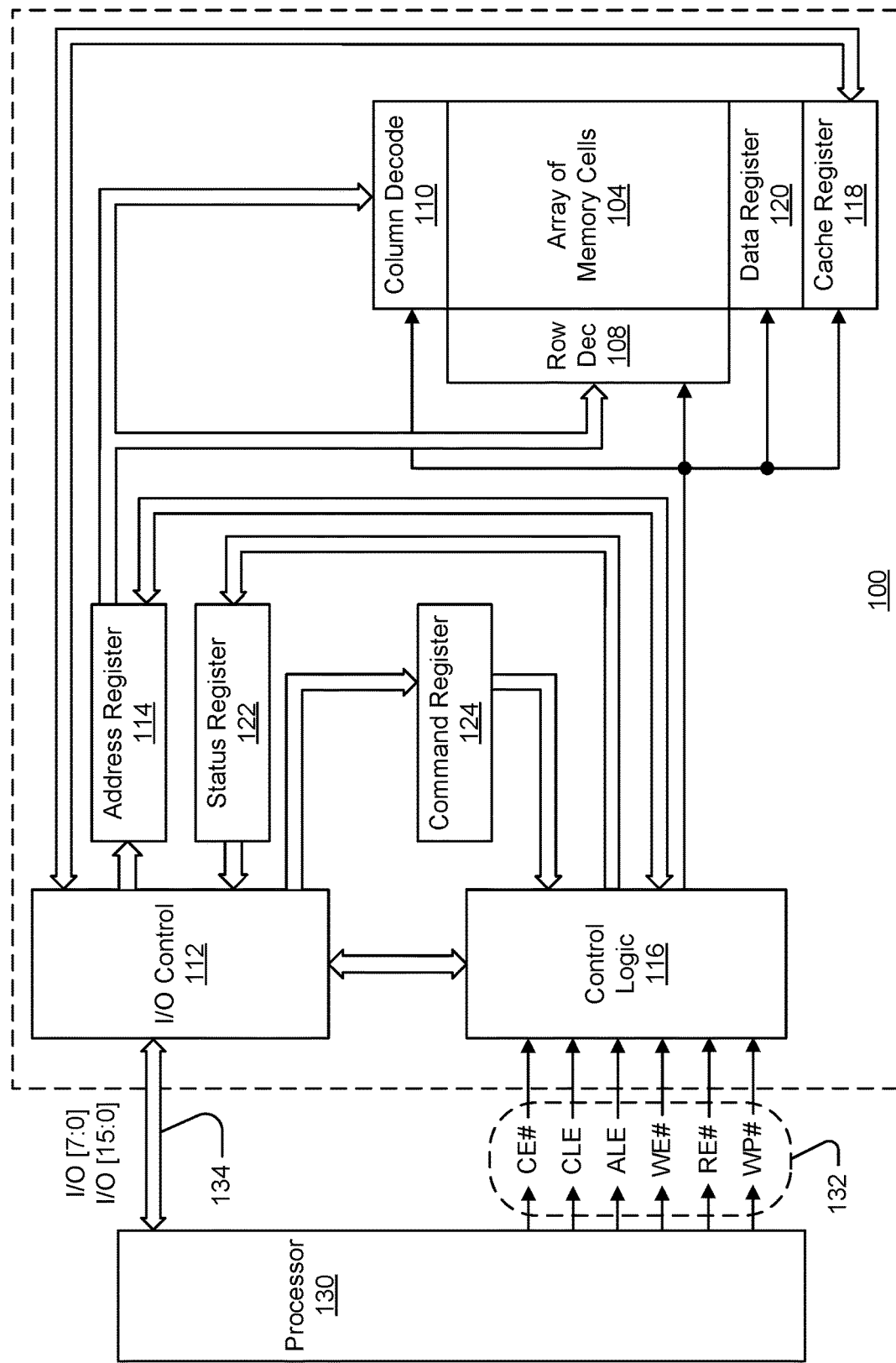
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
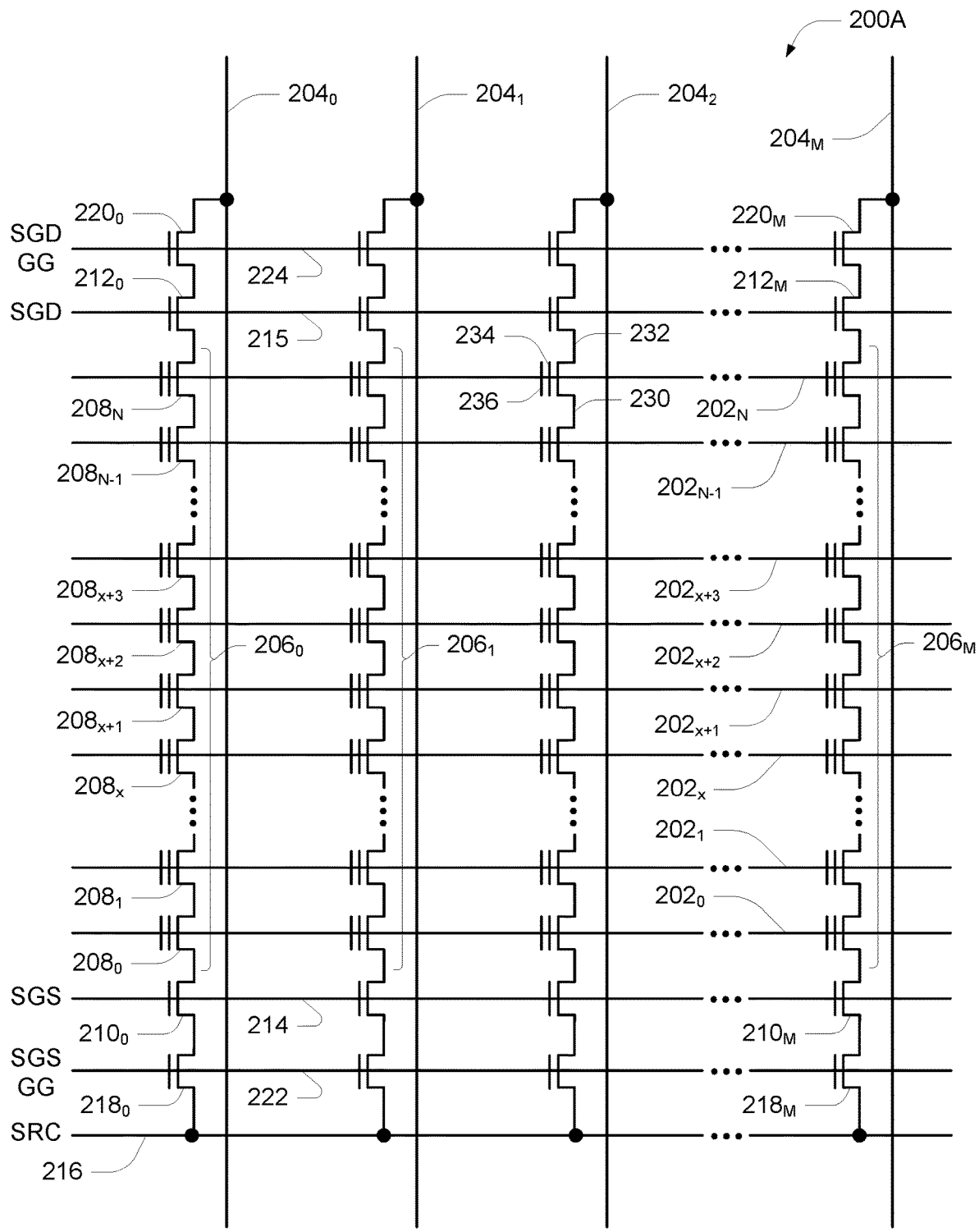
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. Some of the memory cells 208 might represent dummy memory cells, e.g., memory cells not intended to store user data. Dummy memory cells are typically not accessible to a user of the memory, and are typically incorporated into the NAND string 206 for operational advantages, as are well understood.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal. A control gate of each select gate 210 might be connected to select line 214. A control gate of each select gate 212 might be connected to select line 215.

The select gates 210 for each NAND string 206 might be connected in series between its memory cells 208 and a GIDL (gate-induced drain leakage) generator gate 218 (e.g., a field-effect transistor), such as one of the GIDL generator (GG) gates $218_0$ to $218_M$. The GG gates $218_0$ to $218_M$ might be referred to as source GG gates. The select gates 212 of each NAND string 206 might be connected in series between its memory cells 208 and a GG gate 220 (e.g., a field-effect transistor), such as one of the GG gates $220_0$ to $220_M$. The GG gates $220_0$ to $220_M$ might be referred to as drain GG gates.

GG gates $218_0$ to $218_M$ might be commonly connected to a control line 222, such as an SGS_GG control line, and GG gates $220_0$ to $220_M$ might be commonly connected to a control line 224, such as an SGD_GG control line. Although depicted as traditional field-effect transistors, the GG gates 218 and 220 may utilize a structure similar to (e.g., the same as) the memory cells 208. The GG gates 218 and 220 might represent a plurality of GG gates connected in series, with each GG gate in series configured to receive a same or independent control signal. In general, the GG gates 218 and 220 may have threshold voltages different than (e.g., lower than) the threshold voltages of the select gates 210 and 212, respectively. Threshold voltages of the source GG gates 218 might be different than (e.g., higher than) threshold voltages of the drain GG gates 220. Threshold voltages of the GG gates 218 and 220 may be of an opposite polarity than, and/or may be lower than, threshold voltages of the select gates 210 and 212. For example, the select gates 210 and 212 might have positive threshold voltages (e.g., 2V to 4V), while the GG gates 218 and 220 might have negative threshold voltages (e.g., −1V to −4V). The GG gates 218 and 220 might be provided to assist in the generation of GIDL current into a channel region of their corresponding NAND string 206 during an erase operation, for example.

A source of each GG gate 218 might be connected to common source 216. The drain of each GG gate 218 might be connected to a select gate 210 of the corresponding NAND string 206. For example, the drain of GG gate $218_0$ might be connected to the source of select gate $210_0$ of the corresponding NAND string $206_0$. Therefore, in cooperation, each select gate 210 and GG gate 218 for a corresponding NAND string 206 might be configured to selectively connect that NAND string 206 to common source 216. A control gate of each GG gate 218 might be connected to control line 222.

The drain of each GG gate 220 might be connected to the bit line 204 for the corresponding NAND string 206. For example, the drain of GG gate $220_0$ might be connected to the bit line $204_0$ for the corresponding NAND string $206_0$. The source of each GG gate 220 might be connected to a select gate 212 of the corresponding NAND string 206. For example, the source of GG gate $220_0$ might be connected to select gate $212_0$ of the corresponding NAND string $206_0$. Therefore, in cooperation, each select gate 212 and GG gate 220 for a corresponding NAND string 206 might be configured to selectively connect that NAND string 206 to the corresponding bit line 204. A control gate of each GG gate 220 might be connected to control line 224.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
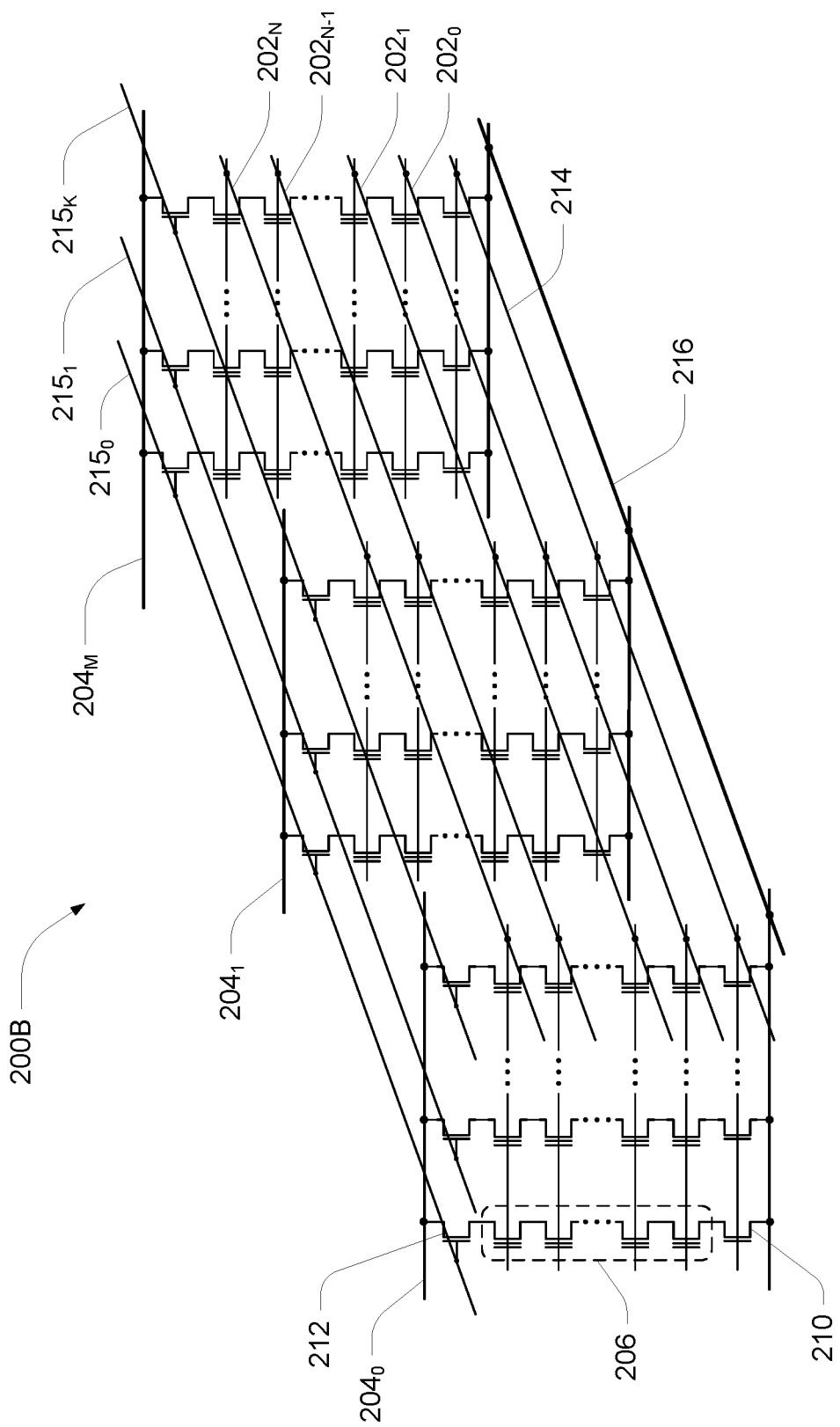

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. However, the structure of FIG. 2B is depicted without the GG gates 218 or 220 for clarity of drawing. Inclusion of the GG gates 218 between the select gates 210 and the source 216, and of the GG gates 220 between the select gates 212 and the corresponding bit lines 204, would be apparent with reference to FIG. 2A. The control lines 222 and 224 might generally utilize the same arrangement as depicted in FIG. 2B for the select lines 214 and 215, respectively, where a single control line 222 might be utilized, and where multiple control lines 224 might be utilized. Alternatively, a single control line 224 might be connected to GG gates 220 in a manner similar to the connection of the control line 214.

The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ (at least in part) by a select transistor 212 (e.g., that may be drain select transistors, commonly referred to as select gate drain) and to a common source 216 (at least in part) by a select transistor 210 (e.g., that may be source select transistors, commonly referred to as select gate source). Multiple NAND strings 206 might be selectively connected to the same bit line 204. For example, subsets of NAND strings 206 could be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3:
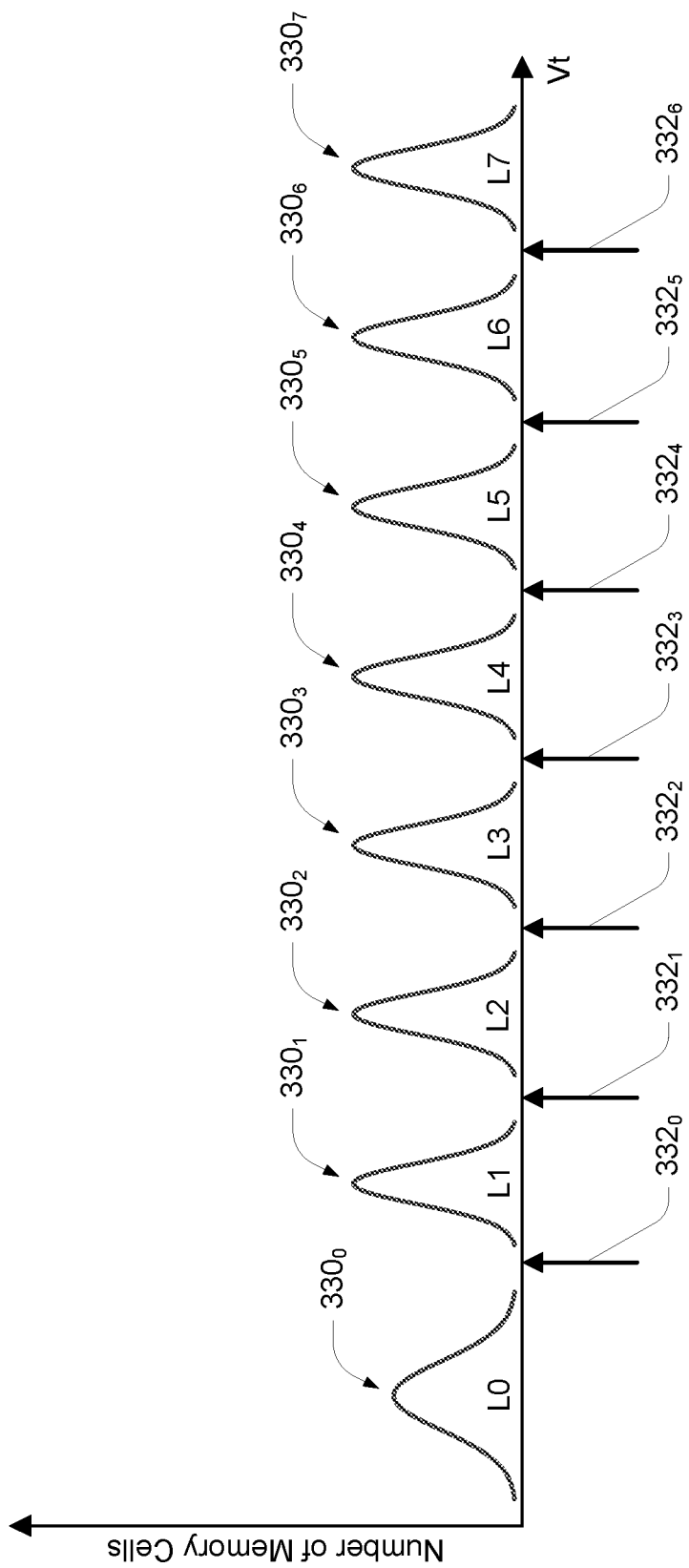
FIG. 3 is a conceptual depiction of threshold voltage ranges of a plurality of memory cells as could be used with embodiments.

FIG. 3 is a conceptual depiction of threshold voltage ranges of a plurality of memory cells as could be used with embodiments. FIG. 3 illustrates an example of threshold voltage ranges and their distributions for a population of eight-level memory cells, often referred to as TLC memory cells. For example, such a memory cell might be programmed to a threshold voltage ($V_t$) that falls within one of eight different threshold voltage ranges $330_0$-$330_7$, each being used to represent a data state corresponding to a bit pattern of three bits. The threshold voltage range $330_0$ typically has a greater width than the remaining threshold voltage ranges $330_1$-$330_7$ as memory cells are generally all placed in the data state corresponding to the threshold voltage range $330_0$, then subsets of those memory cells are subsequently programmed to have threshold voltages in one of the threshold voltage ranges $330_1$-$330_7$. As programming operations are generally more incrementally controlled than erase operations, these threshold voltage ranges $330_1$-$330_7$ may tend to have tighter distributions.

The threshold voltage ranges $330_0$, $330_1$, $330_2$, $330_3$, $330_4$, $330_5$, $330_6$ and $330_7$ might each represent a respective data state, e.g., L0, L1, L2, L3, L4, L5, L6 and L7, respectively. As an example, if the threshold voltage of a memory cell is within the first of the eight threshold voltage ranges $330_0$, the memory cell in this case may be storing a data state L0 having a data value of logical 111 and is typically referred to as the erased state of the memory cell. If the threshold voltage is within the second of the eight threshold voltage ranges $330_1$, the memory cell in this case may be storing a data state L1 having a data value of logical 011. If the threshold voltage is within the third of the eight threshold voltage ranges $330_2$, the memory cell in this case may be storing a data state L2 having a data value of logical 001, and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 1 might be contained within the trim register 128, for example.

TABLE 1

| Data State | Logical Data Value |
| --- | --- |
| L0 | 111 |
| L1 | 011 |
| L2 | 001 |
| L3 | 101 |
| L4 | 100 |
| L5 | 000 |
| L6 | 010 |
| L7 | 110 |

In determining the data states of the memory cells of the various distributions of FIG. 3, read voltages $332_0$-$332_6$ might be used. For example, where the read voltages 332 are applied in increasing order, memory cells first activating in response to the read voltage $332_0$ might be determined to have the data state corresponding to the threshold voltage range $330_0$, memory cells first activating in response to the read voltage $332_1$ might be determined to have the data state corresponding to the threshold voltage range $330_1$, memory cells first activating in response to the read voltage $332_2$ might be determined to have the data state corresponding to the threshold voltage range $330_2$, and so on. Memory cells that do not activate in response to any of the read voltages $332_0$-$332_6$ might be deemed to have the data state corresponding to the threshold voltage range $330_7$. The read voltages $332_0$-$332_6$ might represent a read window of −3V to 5V, for example.

FIG. 4A depicts a timing diagram for a method of operating a memory in accordance with an embodiment. For example, the timing diagram of FIG. 4A might represent an access operation, e.g., a read operation, on a memory cell, or a plurality of memory cells, of a memory. The method might be performed by an internal controller of the memory, e.g., the control logic 116 of the memory 100 of FIG. 1. Trace 440 might represent the voltage level applied to an access line connected to a memory cell selected for the read operation, e.g., a target memory cell. The following discussion will be made with reference to at least FIG. 2A and will presume that the memory cell selected for the read operation is the memory cell $208_x$ of the NAND string $206_0$, such that trace 440 might represent the voltage level applied to access line $202_x$. The access line $202_x$ may be referred to as the selected access line as it is connected to the target memory cell, while remaining access lines 202 may be referred to as unselected access lines. The NAND string $206_0$ may be referred to as the selected string of series-connected memory cells as it contains the target memory cell. Trace 442 might represent the voltage level applied to one or more of the unselected access lines 202, e.g., access lines $202_0$-$202_{x-1}$ and $202_{x+1}$-$202_N$. Trace 444 might represent the voltage level applied to the select line 214 (e.g., SGS) and/or the voltage level applied to the select line 215 (e.g., SGD). Trace 446 might represent the voltage level applied to the control line 222 (e.g., SGS_GG) and/or the voltage level applied to the control line 224 (e.g., SGD_GG). Although the discussion of FIG. 4A is in the context of a target memory cell, more than one memory cell connected to the selected access line might be targeted for the read operation. For example, the read operation might target all memory cells of a page of memory cells connected to the selected access line.

At time t0, a precharge phase might begin. The precharge phase of the read operation might bring the unselected access lines 202 to a voltage level sufficient to activate their respective connected memory cells regardless of their data states, e.g., a pass voltage. As shown in the example of FIG. 4A, the voltage levels of all access lines 202 of the block of memory cells containing the target memory cell (e.g., one or more target memory cells) might be initially brought up to a voltage level 450 from a voltage level 448. The voltage level 450 may be sufficient to activate each memory cell connected to one of the access lines 202 regardless of their data state. As one example, voltage level 450 might be a value within approximately 8V to 9V. The voltage level 448 might be a reference potential, e.g., Vss, 0V or ground. Bringing all of the access lines 202 up together in this manner may facilitate improvements in speed to steady state of any access line 202 whose desired voltage level is the voltage level 450. The select line 214 and/or the select line 215 might be brought up to a voltage level 452 sufficient to activate their respective select gates. The control line 222 and/or the control line 224 might be brought up to a voltage level 454 sufficient to activate their respective GIDL generator gates.

At or around time t1, the selected access line $202_x$ might be discharged to a voltage level 456. The voltage level 456 might represent a read voltage intended to distinguish between possible data states of the target memory cell. For example, if the target memory cell is activated while the voltage level 456 is applied to the access line $202_x$, and thus to the control gate of the target memory cell, it may be deemed to have a data state corresponding to a range of threshold voltages lower than or equal to the voltage level 456. If the target memory cell is deactivated while the voltage level 456 is applied to the access line $202_x$, it may be deemed to have a data state corresponding to a range of threshold voltages higher than the voltage level 456. A sensing operation might be performed between times t2 and t3 while the voltage level 456 is being applied, as is well understood in the art, to determine whether the target memory cell is conducting. As one example, the voltage level 456 might correspond to the read voltage $330_0$. Although the voltage level 456 is visually depicted as being higher than the voltage level 448, the voltage level 456 might be a negative voltage level for some embodiments.

While the voltage level 456 is being applied to the selected access line $202_x$ at time t2, the voltage level 450 is being applied to the unselected access lines $202_0$-$202_{x-1}$ and $202_{x+1}$-$202_N$. In addition, while the voltage level 456 is being applied to the selected access line $202_x$ at time t2, the voltage level 452 might be applied to the select line 214 and/or to the select line 215. Furthermore, while the voltage level 456 is being applied to the selected access line $202_x$ at time t2, the voltage level 454 might be applied to the control line 222 and/or to the control line 224. In this manner, current flow may be established through the NAND string 206 if the target memory cell is activated, but inhibited through the NAND string 206 if the target memory cell is not activated, thus permitting sensing of its data state. As one example, the voltage level 452 might be a value within approximately 2V to 5V. Additionally, the voltage level 454 might also be a value within approximately 2V to 5V. However, the voltage levels 452 and 454 may be different from one another as the threshold voltages of their respective transistors, and their desired operation, may be different.

At time t3, the voltage level applied to the selected access line $202_x$ might be increased to the voltage level 458 while voltage levels of the other traces 442, 444 and 446 might be maintained. The voltage level 458 might represent a different read voltage intended to distinguish between different possible data states of the target memory cell. A sensing operation might be performed between times t3 and t4 while the voltage level 458 is being applied, as is well understood in the art, to determine whether the target memory cell is conducting. As one example, the voltage level 458 might correspond to the read voltage $330_1$.

At time t4, the voltage level applied to the selected access line $202_x$ might be increased to the voltage level 460 while voltage levels of the other traces 442, 444 and 446 might be maintained. The voltage level 460 might represent a different read voltage intended to distinguish between different possible data states of the target memory cell. A sensing operation might be performed between times t4 and t5 while the voltage level 460 is being applied, as is well understood in the art, to determine whether the target memory cell is conducting. As one example, the voltage level 460 might correspond to the read voltage $330_2$.

At time t5, the voltage level applied to the selected access line $202_x$ might be increased to the voltage level 462 while voltage levels of the other traces 442, 444 and 446 might be maintained. The voltage level 462 might represent a different read voltage intended to distinguish between different possible data states of the target memory cell. A sensing operation might be performed between times t5 and t6 while the voltage level 462 is being applied, as is well understood in the art, to determine whether the target memory cell is conducting. As one example, the voltage level 462 might correspond to the read voltage 330₃.

At time t6, the voltage level applied to the selected access line 202ₓ might be increased to the voltage level 464 while voltage levels of the other traces 442, 444 and 446 might be maintained. The voltage level 464 might represent a different read voltage intended to distinguish between different possible data states of the target memory cell. A sensing operation might be performed between times t6 and t7 while the voltage level 464 is being applied, as is well understood in the art, to determine whether the target memory cell is conducting. As one example, the voltage level 464 might correspond to the read voltage 330₄.

At time t7, the voltage level applied to the selected access line 202ₓ might be increased to the voltage level 466 while voltage levels of the other traces 442, 444 and 446 might be maintained. The voltage level 466 might represent a different read voltage intended to distinguish between different possible data states of the target memory cell. A sensing operation might be performed between times t7 and t8 while the voltage level 466 is being applied, as is well understood in the art, to determine whether the target memory cell is conducting. As one example, the voltage level 466 might correspond to the read voltage 330₅.

At time t8, the voltage level applied to the selected access line 202ₓ might be increased to the voltage level 468 while voltage levels of the other traces 442, 444 and 446 might be maintained. The voltage level 468 might represent a different read voltage intended to distinguish between different possible data states of the target memory cell. A sensing operation might be performed between times t8 and t9 while the voltage level 468 is being applied, as is well understood in the art, to determine whether the target memory cell is conducting. As one example, the voltage level 468 might correspond to the read voltage 330₆.

While only seven read voltages are depicted in FIG. 4A, other numbers of read voltages might be used. In general, Y read voltages might be used to distinguish between each of Y+1 possible data states. In addition, while example numeric voltage levels have been provided, these voltage levels are generally dependent upon the technology utilized in fabrication and operation of the integrated circuit device and may be different depending upon the implementation. Furthermore, read operations utilizing ramping of the read voltages, rather than utilizing steps as depicted in FIG. 4A, are well understood and might also be used with embodiments.

Various embodiments seek to mitigate electrical cut-off within the NAND strings following an access operation, e.g., a read operation. In particular, steep potential differences between adjacent devices in a NAND string and its associated select gates and GIDL generator gates can cause injection of charge in the outer devices, which can alter their threshold voltages. For GIDL generator gates, such an increase could lead to inoperability for its intended purpose. To address this issue, various embodiments provide for a particular sequence of discharge of various lines within the array of memory cells. In particular, following an access operation (e.g., a read operation) on a group of memory cells (e.g., block of memory cells) of an array of memory cells, access lines of the accessed group of memory cells might be discharged (e.g., to a reference potential) after select lines of the accessed group of memory cells, and the select lines of the accessed group of memory cells might be discharged after GIDL generator control lines of the accessed group of memory cells.

Accordingly, at time t10, the control line 222 and/or the control line 224 might be discharged, e.g., to the voltage level 448. At time t11, the select line 214 and/or the select line 215 might be discharged, e.g., to the voltage level 448. The period between time t11 and time t10 might be on the order of 2 μs. At time t12, the selected access line 202 and the unselected access line(s) 202 might be discharged, e.g., to the voltage level 448. The period between time t12 and time t11 might be on the order of 300 ns. It is expected that as NAND strings become longer, i.e., contain more series-connected memory cells, longer delays between time t11 and time t10, and between time t12 and t11, may be desired. For some embodiments, the ratio of the period between time t12 and time t11 to the period between time t11 and time t10 might be maintained. For example, the period between time t12 and time t11 might be smaller than the period between time t11 and time t10, and might be an order of magnitude shorter.

Although FIG. 4A was depicted and described with reference to a read operation, each of these conductive lines, e.g., the access lines 202 (e.g., traces 440 and 442), the select lines 214 and/or 215 (e.g., trace 444), and the control lines 222 and/or 224 (e.g., trace 446), might be discharged in the sequence described with reference to time t10 to time t12 from their respective voltage levels for other access operations.

Figure 4B:
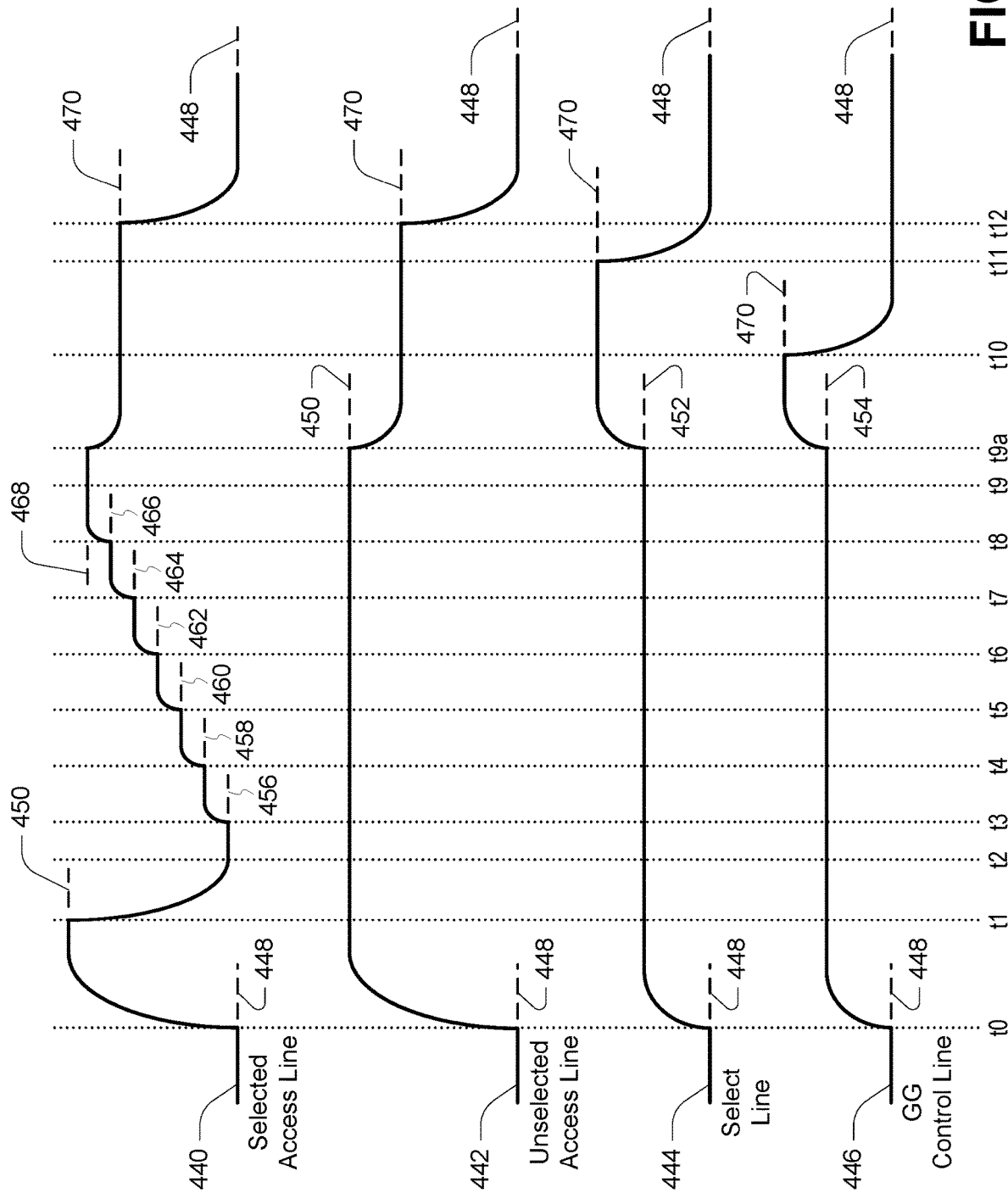

FIG. 4B depicts a timing diagram for a method of operating a memory in accordance with another embodiment. The method of operating a memory of FIG. 4B differs from the method of operating a memory of FIG. 4A in that each trace is brought to a common voltage level 470 at time t9a (e.g., between time t9 and time t10 of FIG. 4A) prior to discharging as described with reference to FIG. 4A. Bringing the access lines, select lines and GG control lines to a common voltage might serve to normalize a channel potential of the NAND string 206 and its associated structures prior to discharging these lines. The voltage level 470 may be lower than the voltage level 450, and may further be lower than the voltage level 468. Although not depicted in this manner in FIG. 4B, the voltage level 470 might further be lower than the voltage level 452. The voltage levels of the traces 440, 442, 444 and 446 might be discharged in the manner described with reference to time t10 to time t12 of FIG. 4A, but each from the voltage level 470. It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be substantially equal regardless of their resulting values.

Figure 5A:
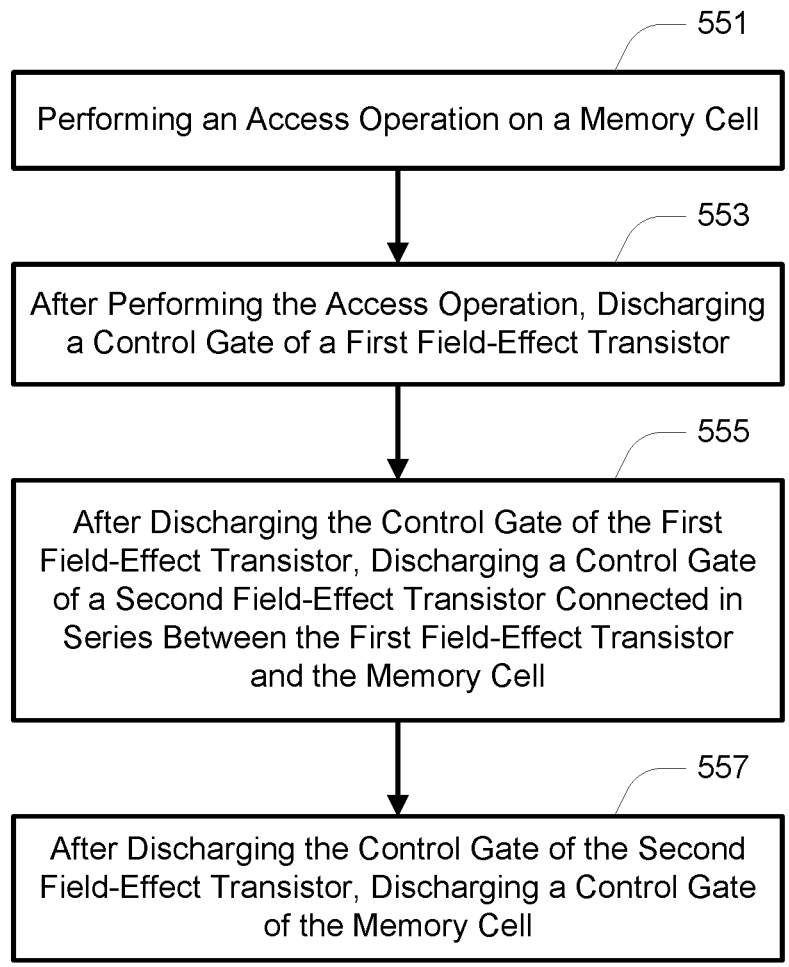
FIGS. 5A-5B are flowcharts of methods of operating a memory in accordance with embodiments.

FIG. 5A is a flowchart of a method of operating a memory in accordance with an embodiment. At 551, an access operation (e.g., an erase operation, a programming operation or a read operation) might be performed on a memory cell. At 553, after performing the access operation, a control gate of a first field-effect transistor (FET) might be discharged. The first FET might be a FET having a source/drain region connected to a source 216 or a data line 204, such as the GG gates 218 or 220, respectively, such as depicted in FIG. 2A. The first FET might be a FET connected in series between a memory cell 208 and a source 216 selectively connected to that memory cell 208, or between a memory cell 208 and a data line 204 selectively connected to that memory cell 208.

Where the first FET is a GG gate 218 or 220, its control gate might be discharged by sinking current from the control line 222 or 224, respectively, connected to its control gate. For example, the control line 222 or 224 could be connected to a reference potential, e.g., Vss, 0V or ground. Control gates of other FETs might also be discharged while discharging the control gate of the first FET. For example, where the first FET corresponds to a GG gate 218, the control gate of the corresponding GG gate 220 might also be discharged, e.g., concurrently. In addition, where the GG gate 218 (and/or GG gate 220) of FIG. 2A represents multiple FETs connected in series, these additional FETs might also have their control gates discharged, e.g., concurrently. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

At 555, after discharging the control gate of the first FET, a control gate of a second FET connected in series between the first FET and the memory cell might be discharged. The second FET might be a select gate 210 or 212, such as depicted in FIG. 2A. For example, where the first FET corresponds to the GG gate 218, the second FET might correspond to the select gate 210, and where the first FET corresponds to the GG gate 220, the second FET might correspond to the select gate 212.

Where the second FET is a select gate 210 or 212, its control gate might be discharged by sinking current from the select line 214 or 215, respectively, connected to its control gate. For example, the select line 214 or 215 could be connected to a reference potential, e.g., Vss, 0V or ground. Control gates of other FETs might also be discharged while discharging the control gate of the second FET. For example, where the second FET corresponds to a select gate 210, the control gate of the corresponding select gate 212 might also be discharged, e.g., concurrently. In addition, where the select gate 210 (and/or select gate 212) of FIG. 2A represents multiple FETs connected in series, these additional FETs might also have their control gates discharged, e.g., concurrently.

At 557, after discharging the control gate of the second FET, a control gate of the memory cell might be discharged. Where the memory cell is a memory cell 208 of a NAND string 206, remaining memory cells of that NAND string 206 might also have their control gates discharged, e.g., concurrently. The control gate of a memory cell 208 might be discharged by sinking current from the access line 202 connected to its control gate. For example, the access line 202 could be connected to a reference potential, e.g., Vss, 0V or ground.

While FETs of a same functional type, e.g., GG gates, select gates or memory cells, were described as being operated upon concurrently within their functional type, some embodiments might provide for sequential operation within a functional type. For example, where the first FET is a GG gate 218, and the GG gate 218 represents multiple FETs connected in series, an outermost GG gate (e.g., having a source/drain connected to the source 216) might be discharged first, followed by discharge of an immediately adjacent GG gate, and so on. This sequential discharge of a functional type might also be utilized within FETs corresponding to the second FET, and FETs corresponding to the memory cell, extending from outermost FETs, e.g., those closest to the data line or source, to the innermost FET(s), e.g., a center memory cell or memory cells of a NAND string.

Figure 5B:
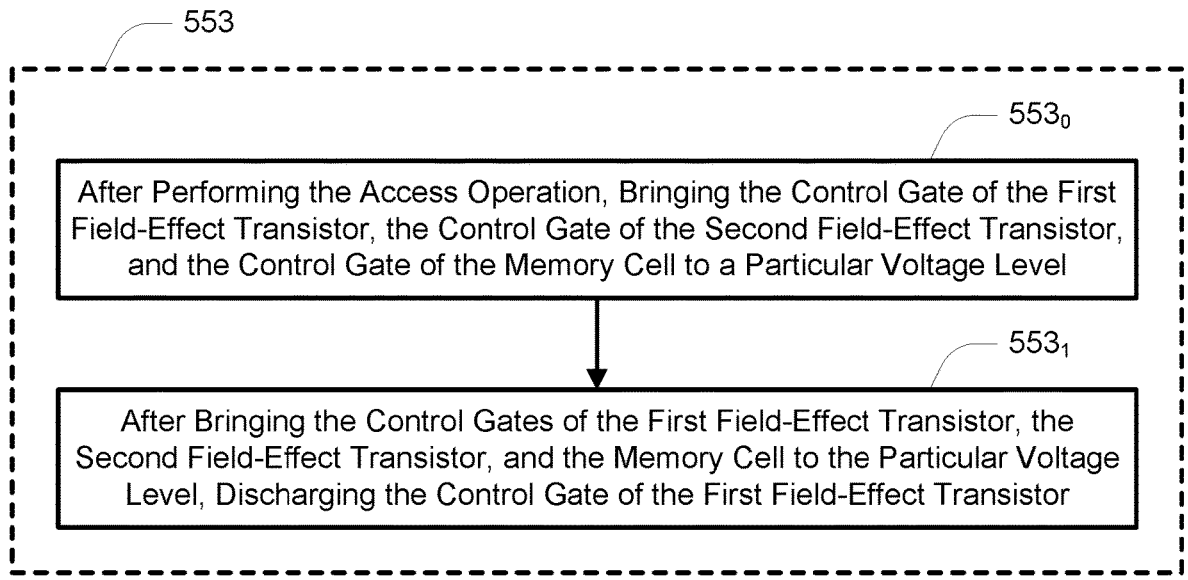

For some embodiments, the various control gates of the method of operating a memory of FIG. 5A might be brought to a particular (e.g., a same) voltage level prior to beginning the sequence of discharging those control gates. FIG. 5B is a flowchart of a method of operating a memory in accordance with such an embodiment.

In particular, FIG. 5B provides additional detail of how the action box 553 of FIG. 5A might be performed. At $553_0$ of FIG. 5B, after performing the access operation of 551 of FIG. 5A, the control gate of the first FET, the control gate of the second FET, and the control gate of the memory cell are brought (e.g., raised or lowered) to a particular voltage level, e.g., concurrently.

Where additional control gates are utilized in the method of operating a memory of FIG. 5A, these might also be brought to the particular voltage level at $553_0$. For example, where the first FET corresponds to the GG gate 218 or 220, the control gate of the corresponding GG gate 220 or 218, respectively, might also be brought to the particular voltage level, e.g., concurrently. Similarly, where the first FET corresponds to the GG gate 218 (or 220) and the GG gate 218 (or 220) represents multiple FETs connected in series, the control gates of these additional FETs might also be brought to the particular voltage level, e.g., concurrently. In addition, where the second FET corresponds to the select gate 210 or 212, the control gate of the corresponding select gate 212 or 210, respectively, might also be brought to the particular voltage level, e.g., concurrently. Similarly, where the second FET corresponds to the select gate 210 (or 212) and the select gate 210 (or 212) represents multiple FETs connected in series, the control gates of these additional FETs might also be brought to the particular voltage level, e.g., concurrently. Furthermore, where the memory cell is a memory cell 208 of a NAND string 206, additional memory cells 208 (e.g., all remaining memory cells 208) of that NAND string 206 might also be brought to the particular voltage level, e.g., concurrently.

At $553_1$ of FIG. 5B, after bringing the control gates of the first FET, the second FET, and the memory cell to the particular voltage level, the control gate of the first FET might be discharged as described with reference to 553 of FIG. 5A. The process might then return to 555 of FIG. 5A.

Figure 6B:
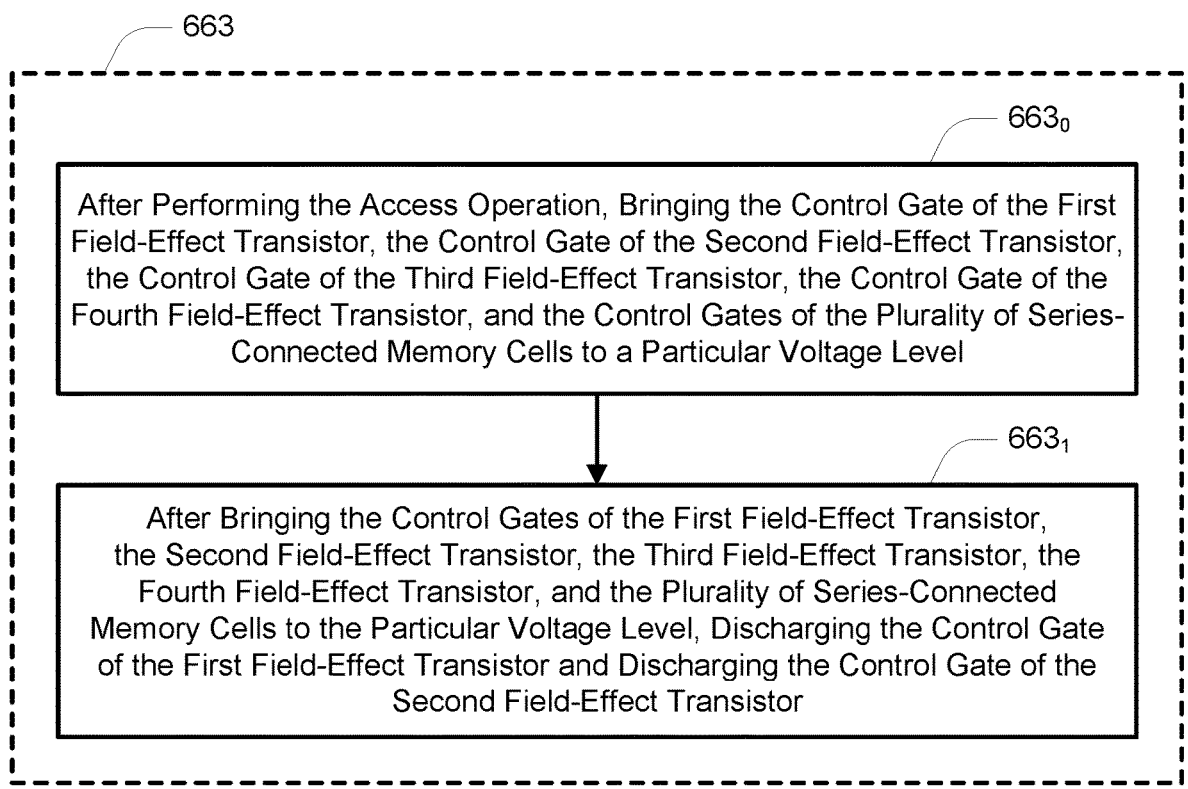
FIGS. 6A-6B are flowcharts of methods of operating a memory in accordance with other embodiments.
Figure 6A:
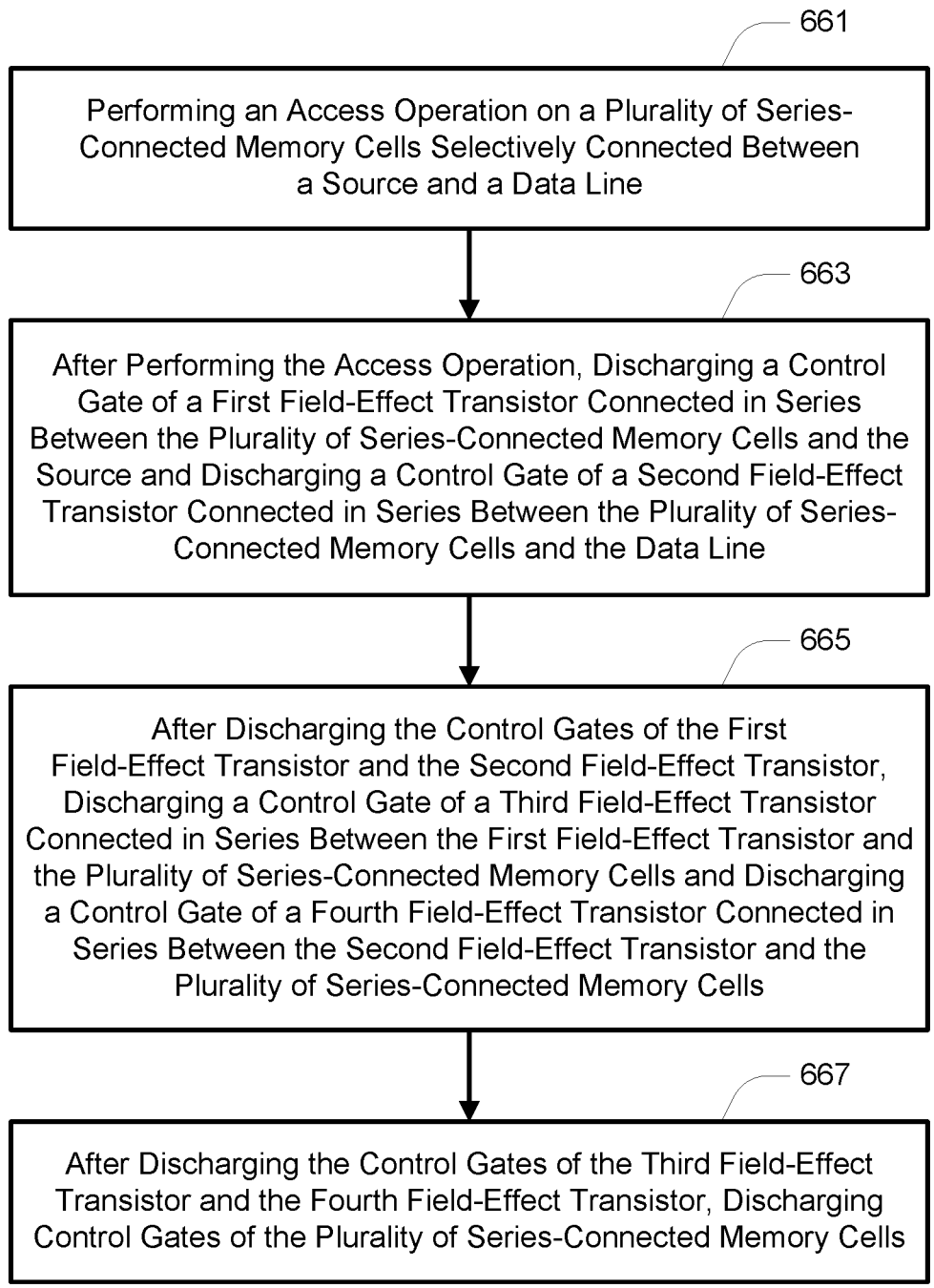

FIG. 6A is a flowchart of a method of operating a memory in accordance with an embodiment. At 661, an access operation (e.g., an erase operation, a programming operation or a read operation) might be performed on a plurality of series-connected memory cells selectively connected between a source and a data line. The plurality of series-connected memory cells might be a NAND string 206 such as depicted in FIG. 2A. For some access operations, only one memory cell 208 of a NAND string 206 might be a target of the access operation, although all memory cells 208 of that NAND string 206 might participate. At 663, after performing the access operation, a control gate of a first field-effect transistor (FET) connected in series between the plurality of series-connected memory cells and the source, and the control gate of a second FET connected in series between the plurality of series-connected memory cells and the data line, might be discharged, e.g., concurrently. The first FET might be a FET having a source/drain region connected to a source 216, such as the GG gate 218 of FIG.

2A, while the second FET might be a FET having a source/drain region connected to the data line 204, such as the GG gate 220 of FIG. 2A.

Where the first FET is the GG gate 218 and the second FET is the GG gate 220, their control gates might be discharged by sinking current from the control lines 222 and 224, respectively, connected to their control gates. For example, the control line 222 or 224 could be connected to a reference potential, e.g., Vss, 0V or ground. Control gates of other FETs might also be discharged while discharging the control gates of the first FET and of the second FET. For example, where the GG gate 218 (and/or GG gate 220) of FIG. 2A represents multiple FETs connected in series, these additional FETs might also have their control gates discharged, e.g., concurrently.

At 665, after discharging the control gates of the first FET and the second FET, a control gate of a third FET connected in series between the first FET and the plurality of series-connected memory cells, and a control gate of a fourth FET connected in series between the second FET and the plurality of series-connected memory cells, might be discharged, e.g., concurrently. The third FET might be the select gate 210 of FIG. 2A, while the fourth FET might be the select gate 212 of FIG. 2A.

Where the third FET is the select gate 210 and the fourth FET is the select gate 212, their control gates might be discharged by sinking current from the select lines 214 and 215, respectively, connected to their control gates. For example, the select line 214 or 215 could be connected to a reference potential, e.g., Vss, 0V or ground. Control gates of other FETs might also be discharged while discharging the control gate of the second FET. For example, where the select gate 210 (and/or select gate 212) of FIG. 2A represents multiple FETs connected in series, these additional FETs might also have their control gates discharged, e.g., concurrently.

At 667, after discharging the control gates of the third FET and the fourth FET, control gates of the plurality of series-connected memory cells might be discharged. The control gate of a memory cell 208 might be discharged by sinking current from the access line 202 connected to its control gate. For example, the access line 202 could be connected to a reference potential, e.g., Vss, 0V or ground.

For some embodiments, the various control gates of the method of operating a memory of FIG. 6A might be brought to a particular (e.g., a same) voltage level prior to beginning the sequence of discharging those control gates. FIG. 6B is a flowchart of a method of operating a memory in accordance with such an embodiment.

In particular, FIG. 6B provides additional detail of how the action box 663 of FIG. 6A might be performed. At $663_0$ of FIG. 6B, after performing the access operation of 661 of FIG. 6A, the control gate of the first FET, the control gate of the second FET, the control gate of the third FET, the control gate of the fourth FET, and the control gates of the plurality of series-connected memory cells are brought (e.g., raised or lowered) to a particular voltage level, e.g., concurrently.

Where additional control gates are utilized in the method of operating a memory of FIG. 6A, these might also be brought to the particular voltage level at $663_0$. For example, where the first FET corresponds to the GG gate 218 and the second FET corresponds to the GG gate 220, and where the GG gate 218 and/or 220 represents multiple FETs connected in series, the control gates of these additional FETs might also be brought to the particular voltage level, e.g., concurrently. In addition, where the third FET corresponds to the select gate 210 and the fourth FET corresponds to the select gate 212, and where the select gate 210 and/or 212 represents multiple FETs connected in series, the control gates of these additional FETs might also be brought to the particular voltage level, e.g., concurrently.

At $663_1$ of FIG. 6B, after bringing the control gates of the first FET, the second FET, the third FET, the fourth FET, and the plurality of series-connected memory cells to the particular voltage level, the control gate of the first FET might be discharged and the second FET might be discharged as described with reference to 663 of FIG. 6A. The process might then return to 665 of FIG. 6A.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. An apparatus, comprising:
   an array of memory cells comprising a plurality of strings of series-connected memory cells;
   a common source selectively connected to a first end of a particular string of series-connected memory cells of the plurality of strings of series-connected memory cells;
   a data line selectively connected to a second end of the particular string of series-connected memory cells;
   a first field-effect transistor connected in series between a node and the particular string of series-connected memory cells and configured as a gate-induced drain leakage (GIDL) generator gate for the particular string of series-connected memory cells, wherein the node is selected from a group consisting of the common source and the data line;
   a second field-effect transistor connected in series between the first field-effect transistor and the particular string of series-connected memory cells and configured as a select gate for the particular string of series-connected memory cells; and
   a controller configured to:
      connect the particular string of series-connected memory cells to the node comprising applying a first voltage level to a control gate of the first field-effect transistor configured to activate the first field-effect transistor, and applying a second voltage level to a control gate of the second field-effect transistor configured to activate the second field-effect transistor;
      perform a sensing operation on a selected memory cell of the particular string of series-connected memory cells while the selected memory cell is connected to the node through the first field-effect transistor and through the second field-effect transistor;
      after performing the sensing operation, connect the control gate of the first field-effect transistor to receive a third voltage level lower than the first voltage level;
      after connecting the control gate of the first field-effect transistor to receive the third voltage level, connect the control gate of the second field-effect transistor to receive the third voltage level lower than the second voltage level; and after connecting the control gate of the second field-effect transistor to receive the third voltage level, connect a control gate of the selected memory cell to receive the third voltage level.

2. An apparatus, comprising:
an array of memory cells comprising a plurality of strings of series-connected memory cell s;
a common source selectively connected to a first end of a particular string of series-connected memory cells of the plurality of strings of series-connected memory cells;
a data line selectively connected to a second end of the particular string of series-connected memory cells;
a first field-effect transistor connected in series between a node and the particular string of series-connected memory cells, wherein the node is selected from a group consisting of the common source and the data line;
a second field-effect transistor connected in series between the first field-effect transistor and the particular string of series-connected memory cells; and
a controller configured to:
 connect the particular string of series-connected memory cells to the node comprising applying a first voltage level to a control gate of the first field-effect transistor configured to activate the first field-effect transistor, and applying a second voltage level to a control gate of the second field-effect transistor configured to activate the second field-effect transistor;
 perform a sensing operation on a selected memory cell of the particular string of series-connected memory cells while the selected memory cell is connected to the node through the first field-effect transistor and through the second field-effect transistor;
 after performing the sensing operation, bring the control gate of the first field-effect transistor, the control gate of the second field-effect transistor, and the control gate of the selected memory cell to a third voltage level;
 after bringing the control gate of the first field-effect transistor, the control gate of the second field-effect transistor, and the control gate of the selected memory cell to the third voltage level, connect the control gate of the first field-effect transistor to receive a fourth voltage level lower than the first voltage level and lower than the third voltage level;
 after connecting the control gate of the first field-effect transistor to receive the fourth voltage level, connect the control gate of the second field-effect transistor to receive the fourth voltage level lower than the second voltage level; and
 after connecting the control gate of the second field-effect transistor to receive the fourth voltage level, connect a control gate of the selected memory cell to receive the fourth voltage level.

3. The apparatus of claim 2, wherein the third voltage level is higher than the first voltage level.

4. The apparatus of claim 3, wherein the third voltage level is higher than the second voltage level.

5. The apparatus of claim 3, wherein the third voltage level is lower than the second voltage level.

6. An apparatus, comprising:
an array of memory cells comprising a plurality of strings of series-connected memory cells;
a common source selectively connected to a first end of a particular string of series-connected memory cells of the plurality of strings of series-connected memory cells,
a data line selectively connected to a second end of the particular string of series-connected memory cells;
a first field-effect transistor connected in series between the data line and the particular string of series-connected memory cells,
a second field-effect transistor connected in series between the first field-effect transistor and the particular string of series-connected memory cells;
a third field-effect transistor connected in series between the common source and the particular string of series-connected memory cells;
a fourth field-effect transistor connected in series between the third field-effect transistor and the particular string of series-connected memory cells; and
a controller configured to:
 connect the particular string of series-connected memory cells to the data line comprising applying a first voltage level to a control gate of the first field-effect transistor configured to activate the first field-effect transistor, and applying a second voltage level to a control gate of the second field-effect transistor configured to activate the second field-effect transistor;
 concurrently with connecting the particular string of series-connected memory cells to the data line, connect the particular string of series-connected memory cells to the common source comprising applying a third voltage level to a control gate of the third field-effect transistor configured to activate the third field-effect transistor and applying a fourth voltage level to a control gate of the fourth field-effect transistor configured to activate the fourth field-effect transistor;
 perform a sensing operation on a selected memory cell of the particular string of series-connected memory cells while the selected memory cell is connected to the node through the first field-effect transistor and through the second field-effect transistor;
 after performing the sensing operation, connect the control gate of the first field-effect transistor to receive a fifth voltage level lower than the first voltage level;
 concurrently with connecting the control gate of the first field-effect transistor to receive the third voltage level, connect the control gate of the third field-effect transistor to receive the fifth voltage level lower than the third voltage level; and
 after connecting the control gate of the first field-effect transistor to receive the fifth voltage level, connect the control gate of the second field-effect transistor to receive the fifth voltage level lower than the second voltage level;
 concurrently with connecting the control gate of the second field-effect transistor to receive the fifth voltage level, connect the control gate of the fourth field-effect transistor to receive the fifth voltage level lower than the fourth voltage level; and
 after connecting the control gate of the second field-effect transistor to receive the fifth voltage level, connect a control gate of the selected memory cell to receive the fifth voltage level.

7. An apparatus, comprising:
an array of memory cells comprising a plurality of strings of series-connected memory cells,
a common source selectively connected to a first end of a particular string of series-connected memory cells of the plurality of strings of series-connected memory cells;
a data line selectively connected to a second end of the particular string of series-connected memory cells;
a first field-effect transistor connected in series between a node and the particular string of series-connected memory cells, wherein the node is selected from a group consisting of the common source and the data line;
a second field-effect transistor connected in series between the first field-effect transistor and the particular string of series-connected memory cells; and
a controller configured to:
connect the particular string of series-connected memory cells to the node comprising applying a first voltage level to a control gate of the first field-effect transistor configured to activate the first field-effect transistor, and applying a second voltage level to a control gate of the second field-effect transistor configured to activate the second field-effect transistor;
perform a sensing operation on a selected memory cell of the particular string of series-connected memory cells while the selected memory cell is connected to the node through the first field-effect transistor and through the second field-effect transistor;
after performing the sensing operation, connect the control gate of the first field-effect transistor to receive a third voltage level lower than the first voltage level;
after connecting the control gate of the first field-effect transistor to receive the third voltage level, connect the control gate of the second field-effect transistor to receive the third voltage level lower than the second voltage level; and
after connecting the control gate of the second field-effect transistor to receive the third voltage level, connect a control gate of the selected memory cell to receive the third voltage level,
wherein a threshold voltage of the first field-effect transistor is lower than a threshold voltage of the second field-effect transistor.

8. The apparatus of claim 7, wherein the threshold voltage of the first field-effect transistor is a negative voltage level and the threshold voltage of the second field-effect transistor is a positive voltage level.

9. An apparatus, comprising:
an array of memory cells comprising a plurality of strings of series-connected memory cells;
a common source selectively connected to a first end of a particular string of series-connected memory cells of the plurality of strings of series-connected memory cells;
a data line selectively connected to a second end of the particular string of series-connected memory cells;
a first plurality of field-effect transistors connected in series between a node and the particular string of series-connected memory cells, wherein the node is selected from a group consisting of the common source and the data line;
a second plurality of field-effect transistors connected in series between the first plurality of field-effect transistors and the particular string of series-connected memory cells; and
a controller configured to:
connect a selected memory cell of the particular string of series-connected memory cells to the node comprising activating each field-effect transistor of the first plurality of field-effect transistors, activating each field-effect transistor of the second plurality of field-effect transistors, and activating each memory cell of the particular string of series-connected memory cells between the second plurality of field-effect transistors and the selected memory cell;
perform a sensing operation on the selected memory cell while the selected memory cell is connected to the node;
after performing the sensing operation, connect a respective control gate of each field-effect transistor of the first plurality of field-effect transistors to receive a first voltage level;
after connecting the respective control gate of each field-effect transistor of the first plurality of field-effect transistors to receive the first voltage level, connect a respective control gate of each field-effect transistor of the second plurality of field-effect transistors to receive the first voltage level; and
after connecting the respective control gate of each field-effect transistor of the second plurality of field-effect transistors to receive the first voltage level, connect a respective control gate of each memory cell of the particular string of series-connected memory cells to receive the first voltage level.

10. The apparatus of claim 9, wherein connecting the respective control gate of each field-effect transistor of the first plurality of field-effect transistors to receive the first voltage level comprises sinking current from the respective control gate of each field-effect transistor of the first plurality of field-effect transistors, wherein connecting the respective control gate of each field-effect transistor of the second plurality of field-effect transistors to receive the first voltage level comprises sinking current from the respective control gate of each field-effect transistor of the second plurality of field-effect transistors, and wherein connecting the respective control gate of each memory cell of the particular string of series-connected memory cells to receive the first voltage level comprises sinking current from the respective control gate of each memory cell of the particular string of series-connected memory cells.

11. The apparatus of claim 9, wherein the controller is further configured to:
after performing the sensing operation and before connecting the respective control gate of each field-effect transistor of the first plurality of field-effect transistors to receive the first voltage level, bring the respective control gate of each field-effect transistor of the first plurality of field-effect transistors, the respective control gate of each field-effect transistor of the second plurality of field-effect transistors, and the respective control gate of each memory cell of the particular string of series-connected memory cells to a second voltage level higher than the first voltage level.

12. The apparatus of claim 9, wherein the controller is further configured to concurrently connect the respective control gate of each field-effect transistor of the first plurality of field-effect transistors to receive the first voltage level.

13. The apparatus of claim 12, wherein the controller is further configured to concurrently connect the respective control gate of each field-effect transistor of the second plurality of field-effect transistors to receive the first voltage level.

14. The apparatus of claim 13, wherein the controller is further configured to concurrently connect the respective control gate of each memory cell of the particular string of series-connected memory cells to receive the first voltage level.

15. The apparatus of claim 9, wherein the controller is further configured to sequentially connect the respective control gate of each field-effect transistor of the first plurality of field-effect transistors to receive the first voltage level in an order from the respective control gate of a first field-effect transistor of the first plurality of field-effect transistors nearest to the node, to the respective control gate of a last field-effect transistor of the first plurality of field-effect transistors farthest from the node.

16. The apparatus of claim 15, wherein the controller is further configured to sequentially connect the respective control gate of each field-effect transistor of the second plurality of field-effect transistors to receive the first voltage level in an order from the respective control gate of a first field-effect transistor of the second plurality of field-effect transistors nearest to the node, to the respective control gate of a last field-effect transistor of the second plurality of field-effect transistors farthest from the node.

17. The apparatus of claim 16, wherein the controller is further configured to concurrently connect the respective control gate of each memory cell of the particular string of series-connected memory cells to receive the first voltage level comprising an order from the respective control gate of a first memory cell of the particular string of series-connected memory cells nearest to the node to the respective control gate of the selected memory cell.

18. An apparatus, comprising:
an array of memory cells comprising a plurality of strings of series-connected memory cells;
a common source selectively connected to a first end of a particular string of series-connected memory cells of the plurality of strings of series-connected memory cells;
a data line selectively connected to a second end of the particular string of series-connected memory cells;
a first plurality of field-effect transistors connected in series between a node and the particular string of series-connected memory cells, wherein the node is selected from a group consisting of the common source and the data line;
a second plurality of field-effect transistors connected in series between the first plurality of field-effect transistors and the particular string of series-connected memory cells; and
a controller configured to:
connect a selected memory cell of the particular string of series-connected memory cells to the node comprising activating each field-effect transistor of the first plurality of field-effect transistors, activating each field-effect transistor of the second plurality of field-effect transistors, and activating each memory cell of the particular string of series-connected memory cells between the second plurality of field-effect transistors and the selected memory cell;
perform a sensing operation on the selected memory cell while the selected memory cell is connected to the node;
after performing the sensing operation, bring a respective control gate of each field-effect transistor of the first plurality of field-effect transistors, a respective control gate of each field-effect transistor of the second plurality of field-effect transistors, and a respective control gate of each memory cell of the particular string of series-connected memory cells to a first voltage level;
after bringing the respective control gate of each field-effect transistor of the first plurality of field-effect transistors, the respective control gate of each field-effect transistor of the second plurality of field-effect transistors, and the respective control gate of each memory cell of the particular string of series-connected memory cells to the first voltage level, connect a respective control gate of each field-effect transistor of the first plurality of field-effect transistors to receive a second voltage level lower than the first voltage level;
after connecting the respective control gate of each field-effect transistor of the first plurality of field-effect transistors to receive the second voltage level, connect the respective control gate of each field-effect transistor of the second plurality of field-effect transistors to receive the second voltage level; and
after connecting the respective control gate of each field-effect transistor of the second plurality of field-effect transistors to receive the second voltage level, connect the respective control gate of each memory cell of the particular string of series-connected memory cells to receive the second voltage level.

19. The apparatus of claim 18, wherein the controller being configured to bring the respective control gate of each field-effect transistor of the first plurality of field-effect transistors to the first voltage level comprises the controller being configured to increase a respective voltage level applied to the respective control gate of each field-effect transistor of the first plurality of field-effect transistors, and wherein the controller being configured to bring the respective control gate of each memory cell of the particular string of series-connected memory cells to the first voltage level comprises the controller being configured to decrease a respective voltage level applied to the respective control gate of each memory cell of the particular string of series-connected memory cells.

20. The apparatus of claim 19, wherein the controller being configured to bring the respective control gate of each field-effect transistor of the second plurality of field-effect transistors to the first voltage level comprises the controller being configured to increase a respective voltage level applied to the respective control gate of each field-effect transistor of the second plurality of field-effect transistors.

21. The apparatus of claim 19, wherein the controller being configured to bring the respective control gate of each field-effect transistor of the second plurality of field-effect transistors to the first voltage level comprises the controller being configured to decrease a respective voltage level applied to the respective control gate of each field-effect transistor of the second plurality of field-effect transistors.

22. The apparatus of claim 18, wherein the controller is further configured to bring the respective control gate of each field-effect transistor of the first plurality of field-effect transistors, the respective control gate of each field-effect transistor of the second plurality of field-effect transistors, and the respective control gate of each memory cell of the particular string of series-connected memory cells to the first voltage level concurrently.

23. The apparatus of claim 22, wherein the controller is further configured to concurrently connect the respective control gate of each field-effect transistor of the first plurality of field-effect transistors to receive the second voltage level.

24. The apparatus of claim 22, wherein the controller is further configured to concurrently connect the respective control gate of each field-effect transistor of the second plurality of field-effect transistors to receive the second voltage level.

25. The apparatus of claim 22, wherein the controller is further configured to sequentially connect the respective control gate of each field-effect transistor of the first plurality of field-effect transistors to receive the second voltage level in an order from the respective control gate of a first field-effect transistor of the first plurality of field-effect transistors nearest to the node, to the respective control gate of a last field-effect transistor of the first plurality of field-effect transistors farthest from the node, and to sequentially connect the respective control gate of each field-effect transistor of the second plurality of field-effect transistors to receive the second voltage level in an order from the respective control gate of a first field-effect transistor of the second plurality of field-effect transistors nearest to the node, to the respective control gate of a last field-effect transistor of the second plurality of field-effect transistors farthest from the node.

* * * * *